United States Patent [19]

Shinozaki et al.

[11] 4,045,222

[45] Aug. 30, 1977

[54] ETCH BLEACHING PROCESS

[75] Inventors: Fumiaki Shinozaki; Tomoaki Ikeda; Masayoshi Tsuboi, all of Asaka, Japan

[73] Assignee: Fuji Photo Film Co., Ltd., Minami-ashigara, Japan

[21] Appl. No.: 326,658

[22] Filed: Jan. 26, 1973

[30] Foreign Application Priority Data

Jan. 28, 1972    Japan .................................. 47-10670

[51] Int. Cl.$^2$ ........................... G03F 7/02; G03C 5/54
[52] U.S. Cl. ........................................ 96/33; 96/29 L
[58] Field of Search ................................ 96/29 L, 33

[56] References Cited

U.S. PATENT DOCUMENTS

| 2,494,053 | 1/1950 | Mitson et al. | 96/33 |
| 3,551,150 | 12/1970 | Woodward et al. | 96/33 |
| 3,620,737 | 11/1971 | Etter et al. | 96/33 |
| 3,625,687 | 12/1971 | Dunkle | 96/29 L |

*Primary Examiner*—David Klein
*Attorney, Agent, or Firm*—Sughrue, Rothwell, Mion, Zinn and Macpeak

[57] ABSTRACT

In an etch-bleaching process wherein a hydrophilic layer in/on which a silver image exists is first treated with an etch-bleaching solution the improvement where the hydrophilic layer is subsequently treated with an aqueous solution containing at least one of an oxyacid of chlorine and a salt thereof.

9 Claims, No Drawings

ETCH BLEACHING PROCESS

BACKGROUND OF THE INVENTION

1. Field of the Invention

This invention relates to an etch-bleaching process to be applied to the reversal developing of a line and halftone image (often referred to as a dot image) and the production of a planographic printing plate.

2. Description of the Prior Art

The term "etch-bleaching process" as is used in this disclosure means a process for etching and removing portions of a hydrophilic layer having therein/on a silver image in areas where the silver image exists in/on the hydrophilic portions and the term "etch-bleaching liquid" means a treating solution for selectively attacking and rendering removable portions of a hydrophilic layer containing therein/on a silver image.

The terminology "in/on" the hydrophilic layer is used in the present disclosure to fully describe the generally encountered state of a silver image formed in a hydrophilic layer, that is, while the silver image is generally considered "in" the hydrophilic layer contain, surface-exposed areas do exist where the image may be considered "on" the hyrophilic layer.

Generally, a planographic printing plate is composed of an oleophilic portion forming image areas and a hydrophilic portion forming nonimage areas.

One known process for producing planographic printing plates is characterized by converting the image areas on the hydrophilic surface of the base plate solely into an oleophilic surface. Another process is characterized by first applying a hydrophilic layer on the oleophilic surface and then removing the part of the hydrophilic layer on the image areas to expose the oleophilic layer.

For example, British Pat. No. 1,129,366 discloses a process for producing a planographic printing plate comprising forming a silver image on a hydrophilic layer (which is provided on a base plate having an oleophilic surface) which contains a nuclei substance for the precipitation of silver in a diffusion transfer process and then removing the hydrophilic layer which is not covered by the silver layer from the oleophilic surface to expose the oleophilic base plate.

U.S. Pat. No. 3,385,701 discloses another process for producing planographic printing plates comprising bringing an exposed negative type photosensitive film in contact with a hydrophilic layer which is provided on a base plate having an oleophilic surface and which contains a nuclei substance for the precipitation of silver in a diffusion transfer process to thereby carry out a diffusion transfer developing and to form a silver image on the hydrophilic layer, and then removing the hydrophilic layer which is not covered by the silver layer from the oleophilic surface to expose the oleophilic base surface.

German Patent Publication (OLS) No. 2,048,594 discloses another process for producing a planographic printing plate comprising exposing an original on a photosensitive silver halide emulsion layer which is provided on a sheet of cellulose, organic acid ester having a hydrophilic surface and contains a nuclei substance for diffusion transfer, forming a reverse silver image corresponding to the original on the hydrophilic surface, treating the plate with an aqueous solution of hydrogen peroxide to remove the hydrophilic surface part not covered by the silver layer, thereby exposing the oleophilic surface of the ester sheet.

According to these three processes, the portions not covered by the silver layer are removed by an etch-bleaching process.

Such conventional etch-bleaching processes for treating the plate where only an etch-bleaching liquid is used require strong rubbing of the hydrophilic parts not covered by the silver layer with a sponge or absorbent cotton, resulting in the poor process efficiency and often causing scratches.

In addition, the hydrophilic parts not covered with the silver layer are not always removed and accordingly a clear print is hard to obtain.

SUMMARY OF THE INVENTION

After much empirical work and studies, the inventors reached an improved etch-bleaching process capable of eliminating the above described defects. This etch-bleaching process is characterized in that a hydrophilic layer in/on which a silver image exists is first treated with an etch-bleaching liquid and then with an aqueous solution containing at least one ingredient selected from the group consisting of oxyacids of chlorine or the salts thereof.

DETAILED DESCRIPTION OF THE INVENTION

The term "hydrophilic layer in/on which the silver image exists" means, for example, a silver image obtained from a known silver salt photosensitive material including normal negative type silver halide photosensitive materials, direct positive silver halide photosensitive materials and diffusion transfer silver halide photosensitive materials.

The silver salt photosensitive material may be any such material capable of forming a silver image and having a hydrophilic layer in/or which the silver image exists.

The hydrophilic layer may be hardened or unhardened. For example, hardenable hydrophilic colloids used as the hydrophilic layer forming material include gelatin, gelatin derivatives, such as gelatin phthalate, casein, polyvinyl alcohol, carboxymethyl cellulose and sodium alginate.

The hydrophilic layer in/on which the silver image exists and the known silver salt photosensitive materials are per se well known in the prior art, and no novelty is claimed for the elements which are processed in the process of the present invention. On the contary, the present invention provides a novel post-treatment bath as opposed to a novel photographic element. The most commonly used silver salt photosensitive materials are, of course, the silver halides, i.e., silver chloride, silver bromide, silver iodide and mixed systems thereof. These materials are so well known in the art, as are combinations therewith with binders (hydrophilic colloid materials), that no detail disclosure need be added on this point).

The hydrophilic layer in/on which the silver image is formed using the silver salt photosensitive material is usually provided on a support such as cellulose diacetate, cellulose triacetate, cellulose acetate, cellulose propionate, cellulose butyrate, cellulose acetobutyrate and like cellulose-organic acid esters; cellulose nitrate and like cellulose-inorganic acid esters; polyethylene terephthalate, polyvinyl butyral, polyvinyl acetate, and like polyvinyl acetals; polystyrene, polypropylene and like polyalkylenes; and papers and glasses laminated with polyethylene and like synthetic resins.

The silver image in/on the hydrophilic layer can be for example, a silver image formed on a so-called silver salt diffusion transfer image receiving material having a support and a hydrophilic layer thereon containing a nuclear material for diffusion transfer. Such a hydrophilic layer is usually coated on the surface of the support but may be formed by treating the surface of the hydrophobic support plate to render it hydrophilic. A silver salt diffusion transfer image receiving material having a hydrophilic surface and containing a nuclei substance for diffusion transfer can be obtained, for example, by converting the surface of a hydrophobic support into a hydrophilic surface by any known manner.

The hydrophobic support may be made of an ester of cellulose and an organic acid (e.g., cellulose diacetate, cellulose triacetate, a mixture thereof, cellulose acetate, cellulose butyrate, cellulose acetobutyrate), esters of cellulose and an inorganic acid (e.g., cellulose nitrate), polyvinyl esters (e.g., polyethylene telepthalate, polyvinyl acetate), or polyvinyl acetals (e.g., polyvinyl acetal). For example, the surface of the support made of a cellulose ester can be retarded hydrophilic by hydrolysis with alkali, and one made of polyvinyl acetal can be rendered hydrophilic by hydrolysis with acid.

On the other hand, the surface of a support of polyethylene telephthalate can be made hydrophilic by treating with bichromic acid or nitric acid or by oxidizing with a high frequency ozone discharge.

The introduction of the nuclei substance for diffusion transfer into the hydrophilic portions thus obtained can be carried out by dipping the support into a solution containing the nuclei substance or coating the solution on the surface of the support. In the case of coverting the surface part of the hydrophobic support into a hydrophilic surface by a treating solution, the introduction of the nuclei substance can be simultaneously carried out by incorporating the nuclei substance for the diffusion transfer into the treating solution.

The silver salt diffusion transfer materials, whether they be one sheet or two sheet assemblies are formed in accordance with the prior art, and no novelty per se is attached to the silver salt transfer materials, most especially the image receiving material. Such material and methods of forming them are extremely well known in the art, and representative of the many issued patents disclosing teachings regarding such elements are British Pat. No. 1,243,336 and U.S. Pat. No. 3,676,125.

Negative materials as are used in the present invention generally have a hydrophilic layer where the silver salt is present throughout the entire layer. Accordingly, in these elements there is never any problem encountered with effective bleaching removal due to the thickness of the layer.

On the other hand, quite often in image receiving layers in diffusion transfer elements increased silver is encountered near the surface of the element as compared to portions of the element in the interior thereof. Accordingly, in the case of diffusion transfer image receiving elements the image receiving layer should not be unduly thick.

The etch-bleaching solution of this invention is an aqueous solution containing any generally used oxidant and, if desired, a cupric salt or ferric salt, an acid, and at least one compound reacting with silver ions and forming a complex salt having low solubility in water. The cupric salts and ferric salts are soluble so as to yield cupric ions and ferric ions in the aqueous etch-bleaching solution. Accordingly, any soluble salt where the corresponding positive ion does not have a harmful effect on the compounds of the etch-bleaching solution or the portions of the hydrophilic layer which do not contain silver image portions can be used. Examples of such materials are cupric halides (cupric chloride, cupric bromide, etc.), cupric sulfate, cupric nitrate, potassium ferricyanide and the like.

As the oxidant, hydrogen peroxide, persulfates (e.g. peroxosulfate, peroxobisulfate), perborates and percarbonates can be used. Preferred oxidants are hydrogen peroxide or peroxobisulfate. While any amount of oxidizing agent can be used which is effective to remove the portion of the hydrophilic layer corresponding to the silver image, as a general rule from about 0.3 to about 30 weight % of oxidizing agent based on the weight of the etch-bleaching solution provides very efficient processing results.

It can generally be said that any peroxide soluble in water can be used as the oxidizing agent in the present invention. In addition to the above compounds, other peroxides which can be used pernitric salts, periodate salts and the like.

As the acid, there can be exemplified acetic acid, citric acid, tartaric acid, phthalic acid, maleic acid, benzensulfonic acid and like organic acids, hydrochloric acid, nitric acid, sulfuric acid, phosphoric acid and like inorganic acids. Acids are usually added to the etch-bleaching solution when peroxides are used because most peroxides soluble in water tend to be unstable in aqueous solutions which are basic. However, in those instances where the water soluble peroxide is not unstable in basic solutions, a basic media can be used.

The compounds reacting with silver ions and forming a complex compound having low solubility in water serves to suppress the increase of the Ag ion concentration in the etch-bleaching solution and to smoothly promote the reaction. Halides, tartarates, carbonates, chromates and formates are used as this compound. The preferred compounds are halides. Compounds which form precipitate upon reacting with $Ag^{30}$, $Cu^+$ or $Fe^{+2}$, but which do not form precipitates upon reacting with $Cu^{2+}$ or $Fe^{+3}$ are most preferred.

Each of the ingredients other than oxidant can be added to the etch-bleaching solution in an amount of 0.05–50 wt. %, based on the weight of the water.

Examples of specific etch-bleaching solutions according to this invention are listed below, wherein solution A and solution B are mixed with each other prior to use.

| (1) | solution A; | |
| | cupric chloride (dihydrate) | 10 g |
| | citric acid | 10 g |
| | water | 1 lit. |
| | solution B; | |
| | ammonium peroxobisulfate | 120 g |
| | water | 1 lit. |
| (2) | solution A; | |
| | cupric chloride (dihydrate) | 10 g |
| | citric acid | 10 g |
| | water | 1 lit. |
| | solution B; | |
| | potassium peroxobisulfate | 120 g |
| | water | 1 lit. |
| (3) | solution A; | |
| | cupric sulfate (pentahydrate) | 120 g |
| | citric acid | 170 g |
| | potassium bromide | 10 g |
| | water | 1 lit. |
| | solution B; | |

|     |                              |         |
| --- | ---------------------------- | ------- |
|     | ammonium peroxobisulfate     | 120 g   |
|     | water                        | 1 lit.  |
| (4) | solution A;                  |         |
|     | cupric chloride              | 15 g    |
|     | glacial acetic acid          | 50 m lit. |
|     | water                        | 1 lit.  |
|     | solution B;                  |         |
|     | aqueous solution of hydrogen |         |
|     | peroxide (35 wt.%)           | 100 ml. |
| (5) | solution A;                  |         |
|     | cupric chloride              | 10 g    |
|     | citric acid                  | 10 g    |
|     | water                        | 1 lit.  |
|     | solution B;                  |         |
|     | aqueous solution of hydrogen |         |
|     | peroxide (35 wt.%)           | 100 ml. |

As earlier indicated, the key feature of the present invention is the use of an oxyacid of chlorine as an essential feature in a post-treating bath, that is, a bath after an etch-bleaching solution. Simply stated, as understood in the chemical arts, oxyacids of chlorine are inorganic acids containing chlorine and oxygen. So long as the essential chlorine/oxygen combination of such acids is present, salts thereof may be used. Typical of such salts are the sodium, potassium or calcium hypochlorites or the corresponding chlorites, alkali metal, alkaline earth metal or ammonium salts in general, for instance, salts of hypochlorous acid, chlorous acid, chloric acid and perchloric acid.

The post treating solution of this invention is an aqueous solution of any such oxyacid of chlorine or salts thereof or mixture thereof. Preferred are hypochlorous acid, chlorous acid or the salts thereof, e.g. bleaching powder ($CaCl_2 \cdot Ca(OCl)_2 \cdot 2H_2O$) sodium hypochlorite, potassium hypochlorite, calcium hypochlorite, chlorite or potassium chlorite.

The amounts of such oxyacids of chlorine or salts in the post treating solution can be varied in a wide range from extremely small amounts to large amounts forming several % solution in accordance with the change of the properties of the layer to be etched, the change of the composition the etch-bleaching solution and the kind of the oxyacid used in the post treating solution. For commercial purposes, considering the low cost of the oxyacids or salts, usually from 0.01 to 3% of the oxyacid or salt thereof (calculated as the chloride) based on post-treating solution weight is used in the post-treating solution.

The post treating solution may be acidic, neutral or basic, though the pH of the post treating solution affects the life of the treating solution and its capacity to remove the sludge formed by etching. For this reason, the post treating solution is preferably basic, but in the case of using sodium chlorite, an acid or sodium hypochlorite is preferably added to the post treating solution. In the case of adding hypochlorite to the treating solution, it is preferably basic.

The addition of more than two sorts of chlorite to the treating solution brings out the same effects as that brought out by the addition of one chlorite.

If desired, an organic solvent which is oxidized only with difficulty and which is capable of mixing with water (e.g., methanol, ethanol) may be added to the treating solution.

The post treating solution thus obtained is used at a temperature range of 2°–80° C, preferably 10°–40° C, to obtain favorable effects and durability.

The treating time varies with the properties of the layer to be etched, but is preferably from 5 seconds to 5 minutes.

The post treatment with the aqueous solution containing at least one oxyacid of chlorine or a salt thereof is generally carried out immediately after the treatment with the etch-bleaching solution, but a washing treatment with water may be inserted between both treatments.

More detailed embodiments of the etch-bleaching process according to this invention will be described below.

In order to apply this etch-bleaching process to the usual reversal-developing processes, the exposing and developing treatments are first applied to a normal lithographic-type silver halide photosensitive material, then the photosensitive material is treated with the etch-bleaching solution without fixing and finally treated with an aqueous solution containing an oxyacid of chlorine or a salt thereof. During the final treatment, the surface of the photosensitive material is slightly rubbed with a piece of sponge or cotton to thereby decompose the gelatin layer near the silver image to remove the etched residue and to form recesses thereunder.

The exposing is applied successively over the whole surface of the photosensitive material, which is then developed to develop and blacken the unexposed portions during the first exposing, thus accomplishing reversal. During a first image-wise exposure, silver halide not etched is exposed to light to sensitize the same and in order to develop and blacken a full exposure is conducted.

Since printing of a flat intaglio is carried out using a screen positive a screen negative must be initially formed, then contact-printed and reversed for the case of forming a dot image from the separated positive. Since the screen negative itself can be utilized as a screen positive during a reversal developing treatment, if the reversal developing is easily carried out it will save time and materials in the photoengraving process. Of course, the reversal developing treatment can be carried out with a special reversal developing liquid containing ammonia, but this reversal developing treatment cannot bring out dye trasnfer developing peculiar to lith type photosensitive materials used for making line and dot images. For this purpose, reversal developing making use of the etch-bleaching process is suitable. Conventional etch-bleaching processes cannot fully remove the etching residue, and accordingly an original for plate making required for producing a clear picture is hard to obtain.

According to the etch-bleaching process of this invention, the removal of the etching residue is very easy, and accordingly good original prints can be obtained.

An example of a direct plate making process for producing planographic printing plates using the etch-bleaching process of this invention will now be described.

As particularly described above, the surface part of the oleophilic support plate is rendered hydrophilic and a nuclei substance for diffusion transfer is introduced into the hydrophilic surface to produce a silver salt diffusion transfer image receiving material. A normal negative type silver halide emulsion is applied to the hydrophilic surface, which is exposed and subjected to diffusion transfer developing. By removing the silver halide emulsion layer with hot water, a positive silver image is formed on the hydrophilic surface part of the image receiving material. This image receiving material having a silver image is treated with an etch-bleaching solution, and further treated with an aqueous solution containing at least one oxyacid of chlorine or a salt thereof to remove the hydrophilic layer corresponding to the silver image. The removal of the hydrophilic layer exposes the oleophilic surface of the base plate which becomes an image area capable of inking, thus forming a planographic plate which will produce fine prints.

The reason why fine prints can be obtained from this planographic plate is based on the fact that the non image area or the hydrophilic layer is not scratched by easily removing the oleophilic layer of the image area to be inked with the etch-bleaching solution of this invention, and the etching residue is fully removed.

The etch-bleaching process of this invention can be applied to the production of relief images or like treatments where conventional etch-bleaching processes have hitherto been used.

More specific embodiments of this invention will now be described with reference to several examples.

EXAMPLE 1

A lith type photosensitive material having a high contrast gelatino-silver halide emulsion layer (silver:-gelatin ratio 1:2) composed of Ag chloride 77 mol. %, Ag iodide 0.2 mol. % and the remainder Ag bromide on a base plate (emulsion thickness: 5μ) was exposed and developed for 2 min. at 20° C with a developing solution having the following composition:

| | |
|---|---|
| water (32° C) | 500 ml. |
| anhydrous Na sulfite | 30 g |
| parformadlehyde | 7 g |
| Na metabisulfite | 2.5 g |
| boric acid | 6.5 g |
| hydroquinone | 22 g |
| K bromide | 1.5 g |
| water to make | 1 lit. |

Immediately after developing, the negative image was dipped in a 5 wt. % glacial acetic acid aqueous solution at 25° C for 10 sec and was then immersed in an etch-bleaching solution (solution A and solution B were mixed with each other) having the following composition:

| | |
|---|---|
| solution A | |
| cupric chloride | 5 g |
| citric acid | 5 g |
| water | 1 lit. |
| solution B | |
| aqueous solution of hydrogen peroxide (35 wt. %) | 100 ml. |
| water | 1 lit. |

In the case that the negative image was dipped in this etch-bleaching solution at 25° C for 4 min., the surface had to be rubbed to remove the etching residue, whereas in the case that the negative image was dipped in the etch-bleaching solution for 3 min, and then dipped 1 min. in a solution (25° C) composed of 10 ml. of an aqueous solution of Na hypochlorite (effective chlorine 10 wt. %), Na hydroxide 200 mg and water 1 lit., the etching residues could be removed without rubbing. After washing with water and further exposing, the negative was developed with the described developing solution and a good positive image was obtained.

EXAMPLE 2

A sheet of cellulose triacetate having a thickness of 155μ was dipped in treating solution D (described below) at 40° C for 60 sec. to thereby hydrolyze and render the surface part hydrophilic and simultaneously to introduce Ni sulfide into the latter. Thus, a silver salt diffusion transfer image receiving material was produced.

Solution D was produced by first mixing solution A composed of glycerin (100 g) and 30 ml. of ammonium sulfide (an aqueous solution of an S value of 14.3 wt. %) with solution B composed of glycerin (180 g) and 0.3 g Ni chloride (hexahydrate), agitating at 30° C for 5 min. to form solution C, and mixing the resultant solution C (250 g) with a separately prepared solution composed of methyl alcohol 3000 g, water 2000 g and Na hydroxide 500 g.

A high ortho color sensitive Ag chlorobromide emulsion (70% Ag chloride) containing 1 mol. of Ag per 1 kg of the emulsion which was gold and color-sensitized was coated on the surface of the image receiving material to form a layer of 4 μ dry thickness. After exposing, this emulsion layer was developed for 30 sec with a diffusion transfer developing solution kept at 20° C and composed of anhydrous Na sulfite 70 g, hydroquinone 20 g, anhydrous Na thiosulfate 10 g, K bromide 1.5 g, Na hydroxide 15 g and water 1 lit.. Then, the image receiving material was washed with water at 40° C to remove the emulsion layer and to obtain a positive image which was then treated for 30 sec. with an etch-bleaching solution composed of cupric chloride 5 g, citric acid 5 g, ammonium peroxobisulfate 130 g and water 1 lit.. Immediately after etch-bleaching treatment, the positive image had to be rubbed for a long time to remove the etching residue. However, by dipping the etch-bleached positive image in a solution at 25° C composed of an aqueous solution of Na hypochlorite (effective chlorine 10 wt. %) 10 ml. Na hydroxide 200 ml. and water 1 lit. for 15 sec., the etching residue could be removed without damaging the hydrophilic surface of the non image areas, thus producing the favorable prints.

EXAMPLE 3

A printing plate was obtained in the same manner as described in Example 2 except for treating with an etch-bleaching solution composed of an aqueous solution of Na hypochlorite (effective chlorine 10 wt. %) 10 ml. and water 1 lit. for 10 sec., at 30° C. According to this etch-bleaching treatment, the etching residue was easily removed as in the Example 2, thus enabling one to obtain a favorable print.

EXAMPLE 4

A printing plate was obtained in the same manner as in Example 2 except for post-treating for 15 sec. with a solution kept at 25° C and composed of a strong bleaching powder (main ingredient Ca hypochlorite) 10 g, Na hydroxide 200 mg and water 1 lit. after the etch-bleaching treatment. According to this treatment, the etching residue was easily removed as in Example 2 to obtain a favorable print.

EXAMPLE 5

A printing plate was obtained in the same manner as described in example 2 except for post-treating for 15 sec. with a solution kept at 25° C and composed of Na chlorite 5 g, Na hydroxide 2000 mg and water 1 lit. after the etch-bleaching treatment. According to this treatment, the etching residue was easily removed as in Example 2 to obtain a favorable prints.

EXAMPLE 6

A printing plate was obtained in the same manner as described in Example 2 except for post-treating for 15 sec. with a solution kept at 25° C and composed of Na chlorite 5 g, glacial acetic acid (90 wt. %) 0.5 ml. and water 1 lit. after the etch-bleaching treatment. Favorable results were obtained as in Example 2.

EXAMPLE 7

A printing plate was obtained in the same manner as described in Example 2 except for post-treating for 15 sec. with a solution kept at 25° C and composed of an aqueous solution of Na hypochlorite (effective chlorine 10 wt. %) 5 ml., Na chlorite 5 g and water 1 lit. Favorable results were obtained as in the Example 2.

While this invention has been described with reference to particular embodiments thereof, it will be understood that numerous modifications may be made by those skilled in the art without actually departing from the spirit and scope of this invention. Therefore, the appended claim is intended to cover all such equivalent variations as within the true spirit and scope of this invention.

What is claimed is:

1. In an etch-bleaching process wherein a hydrophilic layer in/on which a silver image exists is first treated with an etch-bleaching solution, to remove those portions of the hydrophilic layer corresponding to the silver image the improvement wherein the hydrophilic layer is subsequently treated with an aqueous solution containing at least one of an oxyacid of chlorine and a salt thereof to remove etched residue of the hydrophilic layer in the area corresponding to the silver image.

2. The process of claim 1 wherein the etch-bleaching solution comprises an aqueous solution containing an oxidant.

3. The process of claim 1 wherein the etch-bleaching solution further contains at least one compound reacting with silver ions and forming a complex salt having low solubility in water.

4. The process of claim 2 wherein the oxidant is a peroxide, persulfate, perborate or percarbonate.

5. The process of claim 1 wherein the oxyacid of chlorine is hypochlorous acid, chlorous acid, chloric acid, perchloric acid or a salt thereof.

6. The process of claim 5 wherein the oxyacid of chlorine is present in an amount of from about 0.01 to 3% by weight (calculated as chloride).

7. The process of claim 1, wherein said hydrophilic layer is gelatin, a gelatin derivative, casein, polyvinyl alcohol, carboxymethyl cellulose or sodium alginate.

8. The process of claim 1, wherein the hydrophilic layer is provided by hydrolysis of a cellulose-organic ester.

9. The process of claim 8, wherein said cellulose-organic ester is cellulose diacetate, cellulose triacetate, a mixture thereof, cellulose acetate, cellulose butyrate, or cellulose acetobutyrate.

* * * * *